US011384919B2

(12) United States Patent
Ting et al.

(10) Patent No.: US 11,384,919 B2
(45) Date of Patent: Jul. 12, 2022

(54) VEHICLE LAMP WITH A HEATING FUNCTION AND METHOD FOR MANUFACTURING COMPONENTS OF THE VEHICLE LAMP

(71) Applicant: MIN HSIANG CORPORATION, Tainan (TW)

(72) Inventors: Ming-Hung Ting, Tainan (TW); Jui-Hung Hung, Kaohsiung (TW)

(73) Assignee: MIN HSIANG CORPORATION, Tainan (TW)

( * ) Notice: Subject to any disclaimer, the term of this patent is extended or adjusted under 35 U.S.C. 154(b) by 419 days.

(21) Appl. No.: 16/718,489

(22) Filed: Dec. 18, 2019

(65) Prior Publication Data
US 2021/0148539 A1    May 20, 2021

(30) Foreign Application Priority Data
Nov. 14, 2019   (TW) ................. 108215091

(51) Int. Cl.
| F21S 45/60 | (2018.01) |
| F21V 29/90 | (2015.01) |
| H05K 1/02 | (2006.01) |
| H05B 3/84 | (2006.01) |
| F21S 41/141 | (2018.01) |

(52) U.S. Cl.
CPC ............. *F21S 45/60* (2018.01); *F21S 41/141* (2018.01); *F21V 29/90* (2015.01); *H05B 3/84* (2013.01); *H05K 1/0274* (2013.01)

(58) Field of Classification Search
CPC ......... F21S 45/60; F21S 41/141; F21V 29/90; H05B 3/84; H05K 1/0274
See application file for complete search history.

(56) References Cited

U.S. PATENT DOCUMENTS

| 8,459,848 | B2 | 6/2013 | Marley |
| 8,899,803 | B2 | 12/2014 | Marley |
| 9,709,238 | B2 | 7/2017 | Dunn et al. |
| 10,364,954 | B2 | 7/2019 | Deering |
| 2019/0306926 | A1 | 10/2019 | Deering et al. |
| 2020/0116329 | A1* | 4/2020 | Kim ..................... F21S 41/141 |

\* cited by examiner

*Primary Examiner* — Anne M Hines
(74) *Attorney, Agent, or Firm* — Alan D. Kamrath; Karin L. Williams; Mayer & Williams PC

(57) ABSTRACT

A vehicle lamp includes a housing including a compartment having an opening. A reflective unit and a lighting unit are mounted in the compartment. The lighting unit includes a first circuit board and a first LED. A lens is mounted to a front end of the housing and covers the opening of the compartment. The reflective unit reflects light rays from the first LED to transmit through the lens. A heating unit includes a substrate made of a light transmittable material and a heating layer disposed on the substrate. A sensor is mounted in the compartment for detecting temperature. When the detected temperature is lower than a first predetermined temperature, the heating layer is activated to proceed with an electrical heating operation. When the detected temperature is higher than a second predetermined temperature, the electrical heating operation of the heating layer is stopped or gradually reduced.

16 Claims, 8 Drawing Sheets

VEHICLE LAMP WITH A HEATING FUNCTION AND METHOD FOR MANUFACTURING COMPONENTS OF THE VEHICLE LAMP

BACKGROUND OF THE INVENTION

The present invention relates to a vehicle lamp and a manufacturing method and, more particularly, to a vehicle lamp with a structure capable of heating a lens of the vehicle lamp and a method for manufacturing components of the vehicle lamp.

Vehicles are generally equipped with various lamps including head lamps, tail lamps, direction indicator lamps, and fog lamps to provide an illumination effect and/or an alarm effect. However, in a snow condition, the snow accumulates on surfaces of lens of vehicle lamps and blocks the output light rays. To solve this problem, heating mechanisms have been proposed to heat the lens of vehicle lamps.

U.S. Pat. No. 8,459,848 discloses an outer lens layer, a first adhesive layer, a heating element, a second adhesive layer, and an inner lens layer. The heating element is bonded between the inner and outer lens layer by the first and second adhesive layers. Snow on the outer surface of the outer lens layer can be heated and removed by the heating element. However, the inner and outer lens layers increase the weight. Furthermore, the inner and outer lens layers and the first and second adhesive layers adversely affect the transmittance.

U.S. Pat. Nos. 8,899,803 and 9,709,238 disclose a circuit board having a thermistor affixed to a lens for sensing the temperature. However, when the lens has a higher temperature, the electronic components on the circuit board are apt to damage due to the high temperature or a temperature change.

U.S. Pat. No. 10,364,954 discloses a thermoplastic substrate on which a conductive film is disposed. The thermoplastic substrate and a lens are formed by injection molding. During the injection molding, the flowing plastic material of the lens tends to form corrugations on the thermoplastic substrate, reducing the light transmittance and adversely affecting the output light pattern. Furthermore, a heater circuit is provided and includes an extra conductive element in contact with the conductive film. However, the extra conductive element causes an increase in the costs. Furthermore, the more electrical contacts the more unstable electrical connection.

BRIEF SUMMARY OF THE INVENTION

An objective of the present invention is to provide a vehicle lamp with a heating function for heating a lens while providing improved electrical connection stability, having a reduced number of components, and having reduced costs.

Another objective of the present invention is to provide a vehicle lamp with a heating function for heating a lens while providing improved assembling stability.

A further objective of the present invention is to provide a vehicle lamp with a heating function for heating a lens while providing an aesthetic appearance and avoiding adverse influence on the light output effect.

Still another objective of the present invention is a vehicle lamp with a heating function for heating a lens while providing a better, average heating effect.

In an aspect, a vehicle lamp with a heating function according to the present invention comprises a housing including a compartment having an opening. A reflective unit is mounted in the compartment of the housing. A lighting unit is mounted in the compartment of the housing. The lighting unit includes a first circuit board and a first light emitting diode. A lens is mounted to a front end of the housing and covers the opening of the compartment. The lens includes a front surface and a rear surface. The reflective unit reflects light rays from the first light emitting diode to transmit through the lens. A heating unit includes a substrate made of a light transmittable material and a heating layer. The substrate includes a front face and a rear face. The heating layer is disposed on the substrate and is configured to proceed with an electrical heating operation. A sensor is mounted in the compartment of the housing and configured to detect temperature. When the detected temperature is lower than a first predetermined temperature, the heating layer is activated to proceed with the electrical heating operation. When the detected temperature is higher than a second predetermined temperature, the electrical heating operation of the heating layer is stopped or gradually reduced.

In an example, the heating layer is disposed between the substrate and the lens.

In an example, the heating unit further includes a circuit board. A portion of the substrate and a portion of the heating layer are rearwards bent to form an electrical connection section. The electrical connection section is electrically connected to the circuit board.

In an example, the heating unit further includes a connection seat adjacent to the rear surface of the lens. The circuit board is mounted to a rear side of the connection seat.

In an example, the connection seat includes a through-hole. The electrical connection section extends through the through-hole of the connection seat to electrically connect with the circuit board.

In an example, at least one partitioning board extends rearwards from a center of the compartment, and the connection seat is mounted around the at least one partitioning board.

In an example, the lighting unit further includes a second circuit board and a second light emitting diode mounted on the second circuit board. The reflective unit includes a first reflective hood and a second reflective hood. The first reflective hood is disposed in the compartment at a location above the at least one partitioning board. The second reflective hood is disposed in the compartment at a location below the at least one partitioning board. The first and second circuit boards are received in the compartment of the housing and align with the first and second reflective hoods, respectively.

In an example, the heating layer includes at least one heating wire not extending to an end of the electrical connection section. The circuit board includes a coupler having a groove receiving a plurality of electrical connection plates. The end of the electrical connection section is folded and inserted into the groove to electrically connect the at least one heating wire to the plurality of electrical connection plates.

In an example, the end of the electrical connection section includes at least one guiding angle portion.

In an example, the heating layer includes at least one heating wire extending continuously and back and forth without intersection. An overall area of an upper portion of the heating wire above a central portion of the substrate is smaller than an overall area of a lower portion of the heating wire below the central portion of the substrate.

In an example, the heating layer includes at least one heating wire extending continuously and back and forth without intersection. A spacing between two adjacent parallel sections of the upper portion of the heating wire is larger than a spacing between two adjacent parallel sections of the lower portion of the heating wire.

In another aspect, a method for manufacturing components of the vehicle lamp with the heating function comprises: disposing the heating layer on the substrate; placing the substrate with the heating layer in a mold; and injecting a material of the lens into the mold to form the lens. The lens is securely bonded to the substrate. The heating layer is sandwiched between the lens and the substrate.

In an example, the mold includes a first mold part and a second mold part. Each of the mold includes a side having a feeding inlet, permitting injection of the material of the lens into the mold. The first mold part includes a recessed portion corresponding to the substrate with the heating layer. When the rear surface of the substrate with the heating layer is placed into the recessed portion of the first mold part, the front surface of the substrate with the heating layer and the inlet at the side of the mold have a height difference therebetween.

In an example, the recessed portion includes at least one vacuum suction portion, and the at least one vacuum suction portion includes circular or slit-shaped cross sections.

In an example, the recessed portion includes at least one vacuum suction portion. The heating layer includes at least one heating wire. The at least one vacuum suction portion completely or partially overlaps with the at least one heating wire.

In an example, a portion of the substrate and a portion of the heating layer are bent rearwards to form an electrical connection section. The first mold part includes a groove. The electrical connection section is received in the groove.

In an example, the groove includes an end edge having an arcuate portion in a range of 1.5-2.5 mm. The arcuate portion is configured to guide the electrical connection section into the groove.

The present invention will become clearer in light of the following detailed description of illustrative embodiments of this invention described in connection with the drawings.

DESCRIPTION OF THE DRAWINGS

FIG. 7A is an enlarged view of a circled portion of FIG. 7.

FIG. 7B is an enlarged view of another circled portion of FIG. 7.

DETAILED DESCRIPTION OF THE INVENTION

Figure 1:
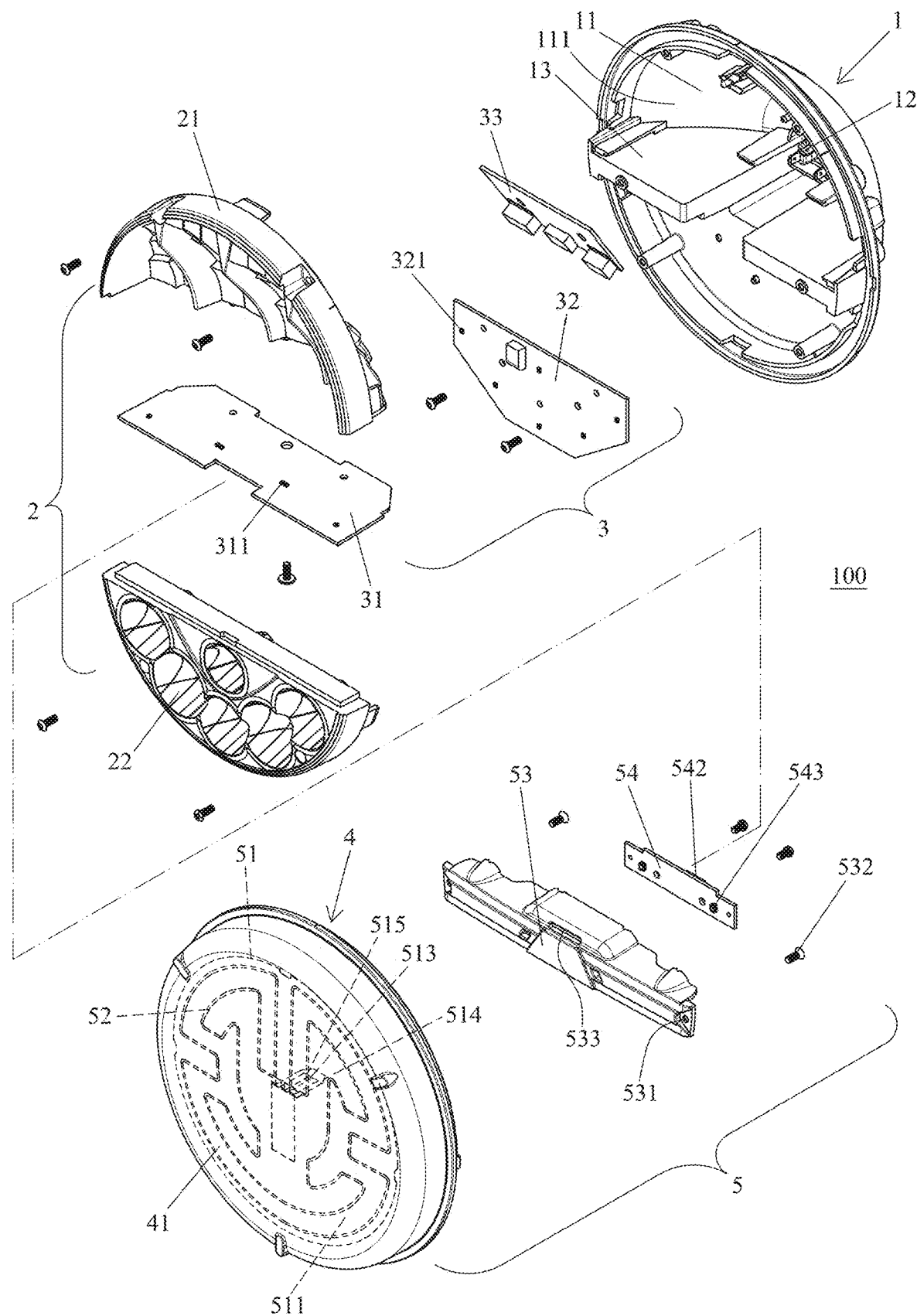
FIG. 1 is an exploded perspective view of a vehicle lamp with a heating function of an embodiment according to the present invention.
Figure 2:
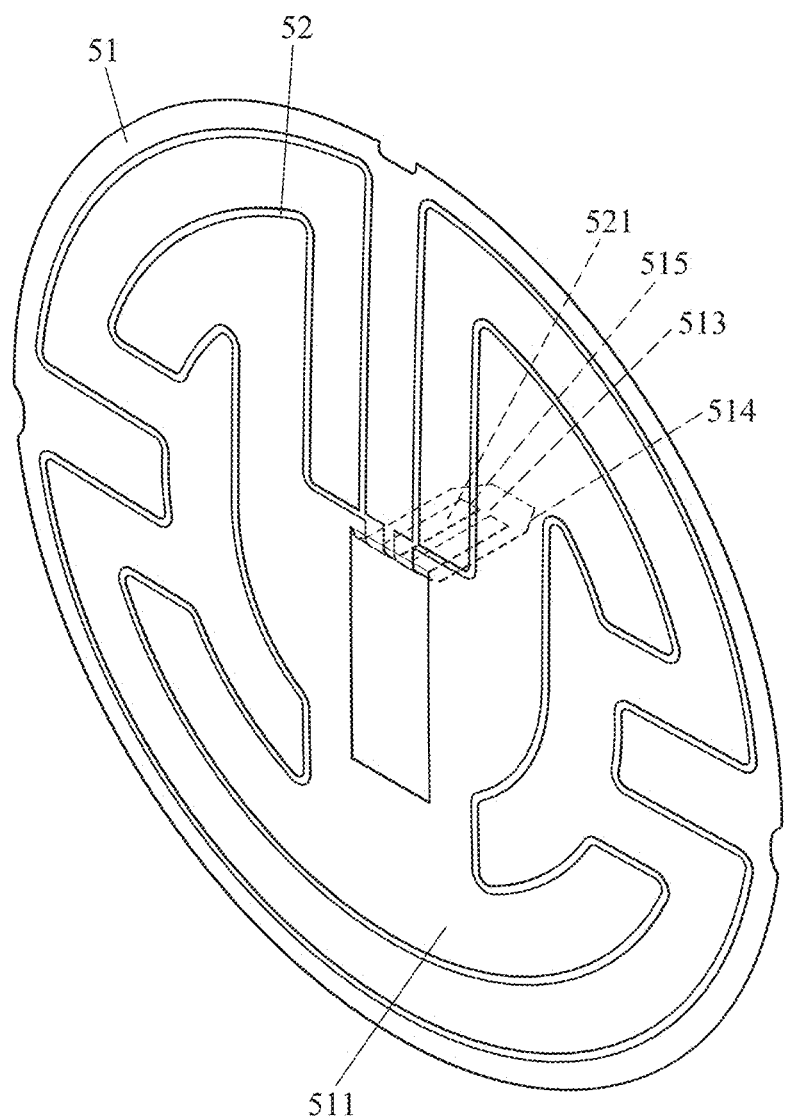
FIG. 2 is a perspective view of a substrate with a heating layer of the vehicle lamp of FIG. 1.
Figure 3:
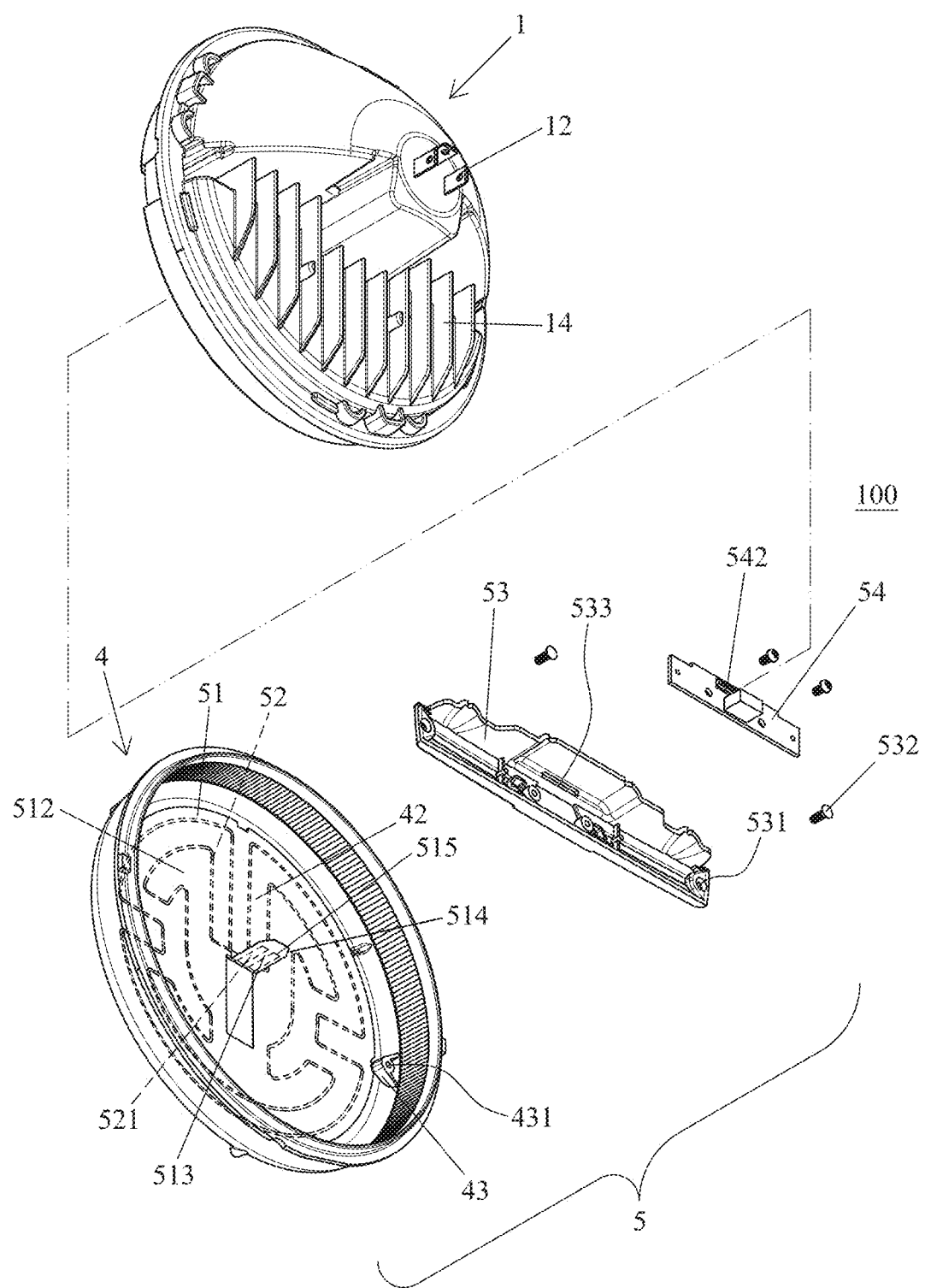
FIG. 3 is another exploded perspective view of the vehicle lamp of FIG. 1 with a reflective unit assembled.
Figure 4:
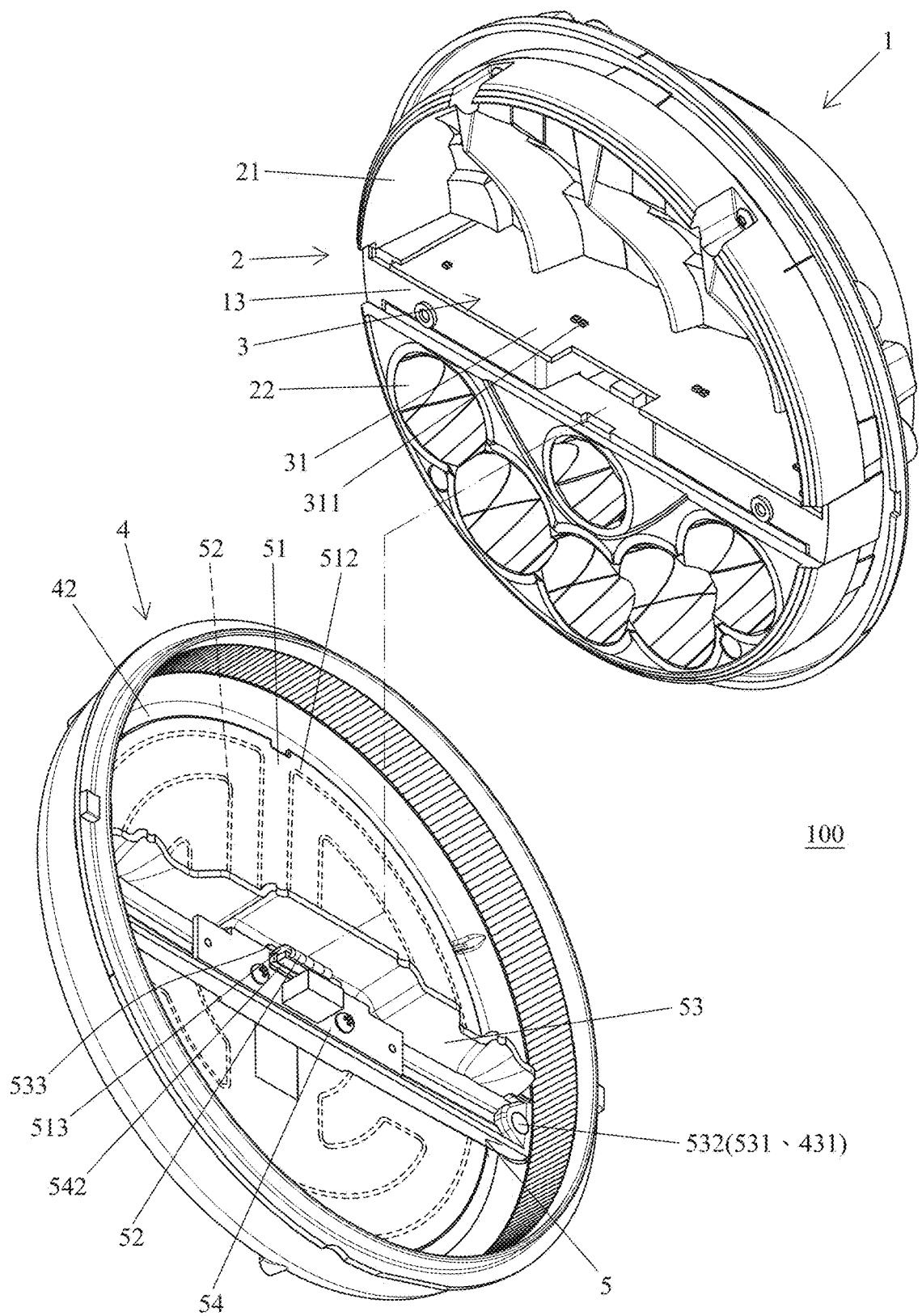
FIG. 4 is an exploded perspective view of the vehicle lamp of FIG. 1 with a connecting seat and a circuit board assembled to the substrate.

With reference to FIGS. 1-7, a vehicle lamp 100 with a heating function with an embodiment according to the present invention comprises a housing 1, a reflective unit 2, a lighting unit 3, a lens 4, and a heating unit 5. The housing 1 includes a compartment 11 in a central portion thereof. The compartment 11 includes a front end having an opening 111. An electrical connection device 12 is mounted to a rear end of the compartment 11 or the housing 1 and is connected to an external power (not shown). At least one partitioning board 13 extends rearwards from a center of the compartment 11. In this non-restrictive embodiment, the housing 1 includes two partitioning boards 13. A plurality of fins 14 is disposed on the rear end of the housing 11. In an alternative embodiment, the housing 1 and the reflective unit 2 can be integrally formed of the same material or different materials. In another non-restrictive embodiment, the reflective unit 2 can be formed on the housing 1 by vapor deposition, spray coating, coating, etc.

The reflective unit 2 is mounted in the compartment 11 of the housing 1 and includes a first reflective hood 21 and a second reflective hood 22. The first reflective hood 21 is disposed in the compartment 11 at a location above the two partitioning boards 13. The second reflective hood 22 is disposed in the compartment 11 at a location below the two partitioning boards 13.

The lighting unit 3 is mounted in the compartment 11 of the housing 1. The lighting unit 3 includes a first circuit board 31 and a second circuit board 32. A first light emitting diode (LED) 311 is mounted on the first circuit board 31. A second LED 321 is mounted on the second circuit board 32. The first and second circuit boards 31 and 32 are received in the compartment 11 of the housing 1 and align with the first and second reflective hoods 21 and 22, respectively. The light rays emitted from the first LED 311 are reflected by the first reflective hood 21 and then transmit through the lens 4, outputting a first lighting pattern corresponding to a low beam. The light rays emitted from the second LED 321 are reflected by the second reflective hood 22 and then transmit through the lens 4, outputting a second lighting pattern corresponding to a high beam. The vehicle lamp 100 according to the present invention further includes control circuit board 33 mounted in the compartment 11 of the housing 1 and electrically connected to the first and second circuit boards 31 and 32 and the electrical connection device 12. The electrical connection wires are not shown in the drawings.

The lens 4 is mounted to a front end of the housing 1 and covers the opening 111 of the compartment 11. The lens 4 includes a front surface 41 and a rear surface 42. The rear surface 42 of the lens 4 includes at least one coupling portion 43 corresponding to the two partitioning boards 3 and having a coupling hole 431.

The heating unit 5 includes a substrate 51, a heating layer 52, a connection seat 53, and a circuit board 54. The substrate 51 is made of a light transmittable material, such as polycarbonate (PC), polymethyl methacrylate (PMMA), etc. Preferably, the substrate 51 has certain flexibility for subsequent disposition on the lens 4 with a curvature or a slight radian. The flexibility can be a result of a thin substrate 51 or the substrate 51 itself is made of a soft material. Nevertheless, the present invention is not limited in this regard.

The heating layer 52 is disposed on the substrate 51 and provides an electrical heating function. The substrate 51 includes a front face 511 and a rear face 512. The substrate 51 is partially cut, and a portion of the substrate 51 and a portion of the heating layer 54 are bent rearwards to form an electrical connection section 513 electrically connected to the circuit board 54. An end 515 of the electrical connection section 513 includes at least one guiding angle portion 514. In this embodiment, the electrical connection section 513 includes two guiding angle portions 514. The heating layer 52 includes at least one heating wire 521 not extending to the end 515 of the electrical connection section 513. In this non-restrictive embodiment, the heating layer 52 includes two heating wires 521 having a substantially uniform spacing therebetween. In this embodiment, the electrical connection section 513 corresponds to a center of the housing 1 or the lens 4. In another embodiment, the electrical connection section 513 corresponds to a side of the housing 1 or the lens 4 or corresponds to a location between the center and the side of the housing 1 of the lens 4.

In this embodiment, the heating layer 52 can be an electrically conductive silver paste coated on the front surface 511 of the substrate 51 and the electrical connection section 513 and can be fixed on the substrate 51 after the silver paste hardens. Namely, the heating layer 52 is disposed on the substrate 51 to form the substrate 51 with the heating layer 52. In another embodiment (not shown), other materials can be added, or the coating can be applied by using other materials. In a further embodiment (not shown), the heating layer 52 can be disposed on a substrate or a board, and the substrate or board is secured to the substrate 51 according to the present invention.

Figure 5:
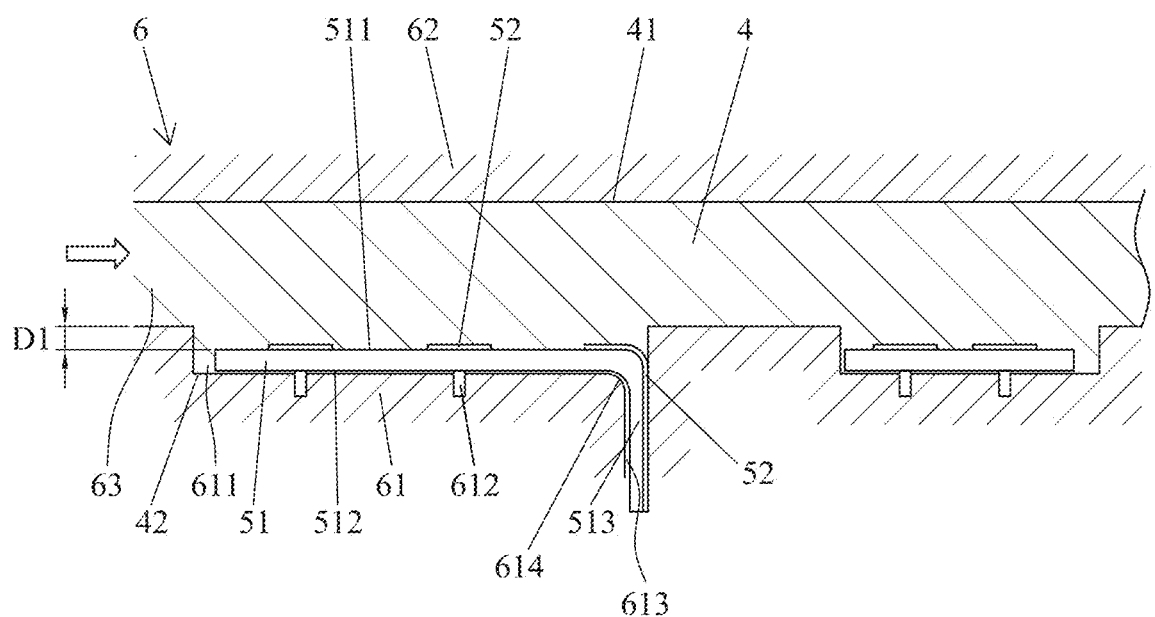
FIG. 5 is a diagrammatic cross sectional view illustrating injection of a lens on the substrate with the heating layer of the vehicle lamp of FIG. 1.
Figure 6:
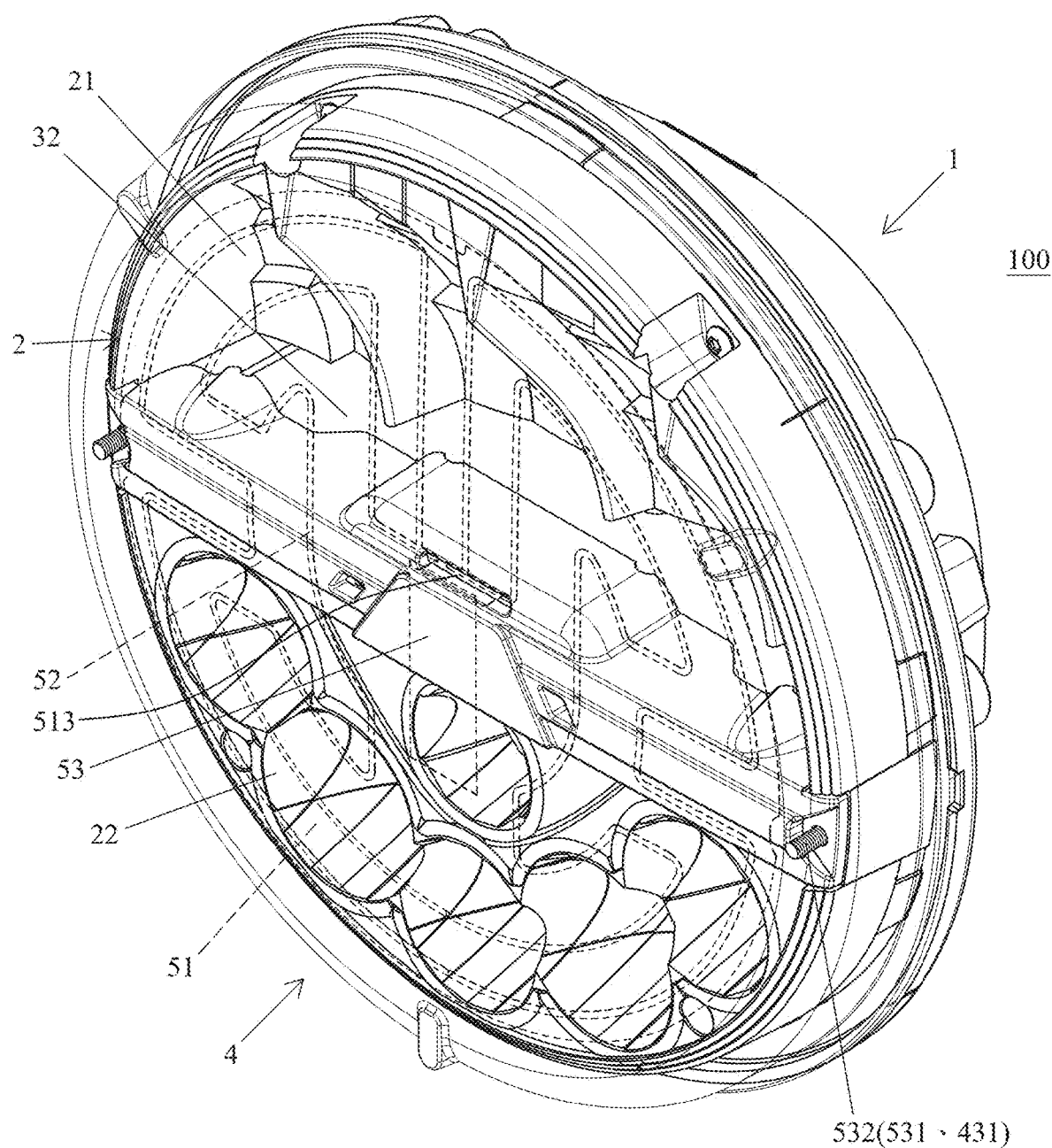
FIG. 6 is a perspective view of the vehicle lamp of FIG. 1 after assembly.

With reference to FIG. 5, the substrate 51 with the heating layer 52 can be placed in a mold 6 for bonding to the rear surface 42 of the lens 4 by injection molding. The mold 6 includes a first mold part 61 and a second mold part 62 that can be coupled to the first mold part 61. The mold 6 includes a side having a feeding inlet 63, permitting injection of a material of the lens 4 into interiors of the first and second mold part 61 and 62 for forming the lens 4, thereby securely bonding the lens 4 to the substrate 51. Furthermore, the first mold part 61 includes a recessed portion 611 corresponding to the substrate 51 with the heating layer 52. When the rear surface 512 of the substrate 51 with the heating layer 52 is placed into the recessed portion 611 of the first mold part 61, the front surface 511 of the substrate 51 with the heating layer 52 and the inlet 63 at the side of the mold 6 have a height difference D1 therebetween.

The recessed portion 611 includes at least one vacuum suction portion 612. In this non-restrictive embodiment, the at least one vacuum suction portion 612 includes slit-shaped cross sections. In another embodiment, the at least one vacuum suction portion 612 can include continuously distributed circles or other shapes. Preferably, the at least one vacuum suction portion 612 corresponds to the at least one heating wire 521 of the heating layer 52, such that the at least one vacuum suction portion 612 completely or partially overlaps with the at least one heating wire 521. Due to suction of the at least one vacuum suction portion 612, suction of slits (not shown) is apt to occur at corresponding locations of the substrate 51. When the at least one vacuum suction portion 612 completely or partially overlaps with the at least one heating wire 521 (not shown), when viewed from the front surface 41 of the lens 4, the at least one heating wire 521 of the heating layer 52 provides a complete or partial covering effect. Thus, the vehicle lamp 100 with a heating function according to the present invention not only provides an aesthetic appearance but also avoids adverse influence on the light output effect.

The first mold part 61 includes a groove 613 corresponding to the electrical connection section 613. Namely, the groove 613 is used to receive the electrical connection section 613. The groove 613 includes an end edge having an arcuate portion 614. The at least one guiding angle portion 514 of the electrical connection section 513 can guide the electrical connection section 513 into the groove 613. Insertion of the electrical connection section 513 and suction of the at least one vacuum suction portion 612 on the substrate 51 with the heating layer 52 provides a positioning effect for the substrate 51 with the heating layer 52.

During filling of the material (such as a liquid plastic material) of the lens 4 via the feeding inlet 63, due to the height difference D1, the flowing material will not directly impact the substrate 51 with the heating layer 52, avoiding formation of corrugations on the substrate 51 with the heating layer 52 during the formation procedure. Furthermore, the arcuate portion 614 of the groove 613 guides the electrical connection section 513 into the groove 613 and avoids generation of pressure at the bends of the electrical connection section 513 and the substrate 51 with the heating layer 52, thereby avoiding breakage of the electrical connection section 513 and/or the substrate 51 and/or the heating layer 52. In this embodiment, the arcuate portion 614 is preferably, but not limited to, in a range of 1.5-2.5 mm. In another embodiment, other forms of the arcuate portion 614 capable of avoiding breakage of the electrical connection section 513 and/or the substrate 51 and/or the heating layer 52 are still within the scope of the arcuate portion 614 according to the present invention. The heating layer 52 can be sandwiched between the lens 4 and the substrate 51 and is isolated from air to avoid oxidation. Furthermore, the heating layer 52 directly contacts with the lens 4 to increase the heating effect for the lens 4.

With reference to FIGS. 2-4, 6, and 7, the connection seat 53 is elongated and adjacent to the rear surface 42 of the lens 4. The connection seat 53 includes at least one coupling hole 531. At least one fastener 532 extends through the at least one coupling hole 531 and the at least one coupling hole 431 to secure the connection seat 53 to the rear side of the lens 4. Furthermore, the connection seat 53 is located in front of the two partitioning boards 13 of the housing 1 without adversely affecting the first and second lighting patterns. The connection seat 53 can be mounted around the two partitioning boards 13.

Figure 7:
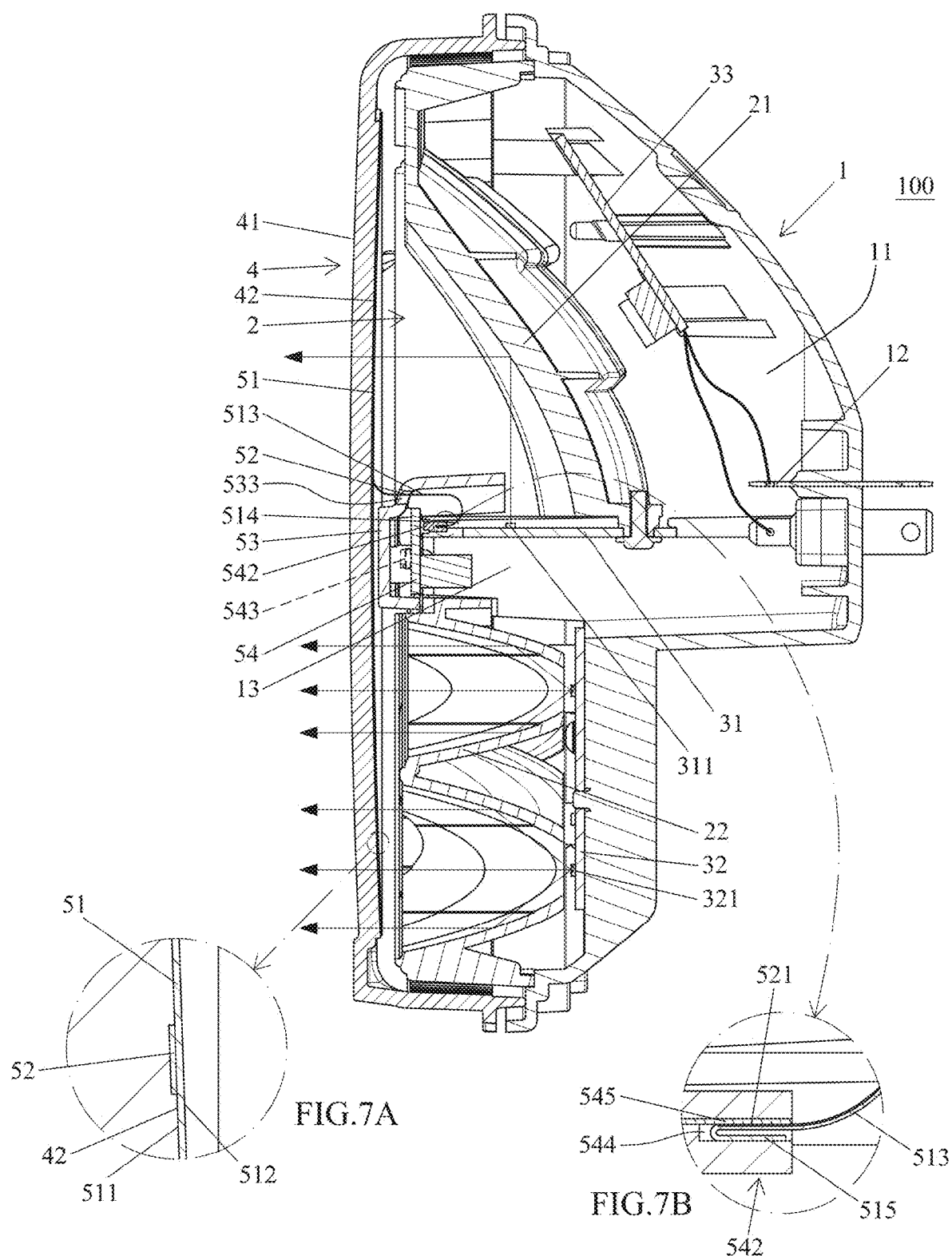
FIG. 7 is another cross sectional view of the vehicle lamp of FIG. 1 after assembly.

The circuit board 54 is mounted to the rear side of the connection seat 53. The connection seat 53 includes a through-hole 533. The electrical connection section 513 extends through the through-hole 533 of the connection seat 53 to electrically connect with the circuit board 54. In this embodiment, the circuit board 54 includes a coupler 542. As shown in FIG. 7, the coupler 542 includes a groove 544 having a plurality of electrical connection plates 545 (only one is shown in FIG. 7). The end 515 of the electrical connection section 513 can be folded and then inserted into the groove 544 to electrically connect the heating wire 521 with the plurality of electrical connection plates 545. Thus, the thickness of the front end of the electrical connection section 513 can be increased by folding the end 515, thereby increasing the coupling stability between the electrical connection section 513 and the coupler 542. The returning flexibility of the end 515 further enhances the electrical coupling effect between the heating wire 521 and the plurality of electrical connection plates 545. In another non-restrictive embodiment, both the electrical connection section 513 and the circuit board 54 have a coupler for electrical connection purposes. The circuit board 54 is electrically connected to the control circuit board 33. In this embodiment, the control circuit board 33 is used to control the heating layer 52. In another non-restrictive embodiment, the circuit board 54 is used to control the heating layer 52 and is electrically connected to the electrical connection device 12.

The vehicle lamp 100 according to the present invention further includes a sensor 543 mounted in the compartment 11 of the housing 1 for detecting temperature. When the detected temperature is lower than a first predetermined temperature, the heating layer 52 is activated to proceed with the electrical heating operation. When the detected temperature is higher than a second predetermined temperature, the electrical heating operation of the heating layer 52 is stopped or gradually reduced.

In this embodiment, the electrical heating operation is stopped without further heating. Gradual reduction of the electrical heating operation of the heating layer 52 refers to gradual reduction of the electric current, such that the heating layer 52 gradually increases the temperature, maintains the temperature, or gradually reduces the temperature. Nevertheless, the present invention is not limited in this regard. In this embodiment, the first predetermined temperature is 0° C., and the second predetermined temperature is 20° C. In another embodiment, the first predetermined temperature is −5° C., and the second predetermined temperature is 15° C. In a further embodiment, the first predetermined temperature is 20° C., and the second predetermined temperature is 30° C. Nevertheless, the present invention is not limited in this regard.

In an alternative embodiment (not shown), when the vehicle lamp 100 according to the present invention is started, the electrical heating operation of the heating layer 52 starts. When the detected temperature is higher than a second predetermined temperature, the electrical heating operation of the heating layer 52 is stopped or gradually reduced. When the detected temperature is lower than the first predetermined temperature, the electrical heating operation of the heating layer 52 starts again. The circuit board 54 is disposed on the connection seat 53 without in direct contact with the lens 4, avoiding damage to the electronic components of the circuit board 54 due to a higher temperature or a temperature change.

Since the connection seat 53 is aligned with the two partitioning boards 13, the outputted first and second lighting patterns of the first and second LEDs 311 and 321 after reflection by the first and second reflection hoods 21 and 22 will not be adversely affected. Furthermore, the substrate 51 (with the heating layer 52) and the lens 4 are integrally formed by injection molding, reliably bonding the substrate 51 (with the heating layer 52) with the lens 4 without the risk of disengagement.

The electrical connection section 513 of the substrate 51 with the heating layer 52 is electrical connection with the circuit board 54, providing a more stable electrical connection between the circuit board 54 and the substrate 51 with the heating layer 52. In comparison with conventional circuit boards with conventional heating circuit boards requiring connection with the heating layer (such as a conventional conductive film) by extra wires or springs, the above arrangement according to the present invention provides more stable electrical connection, a reduced number of components, and reduced costs.

Figure 8:
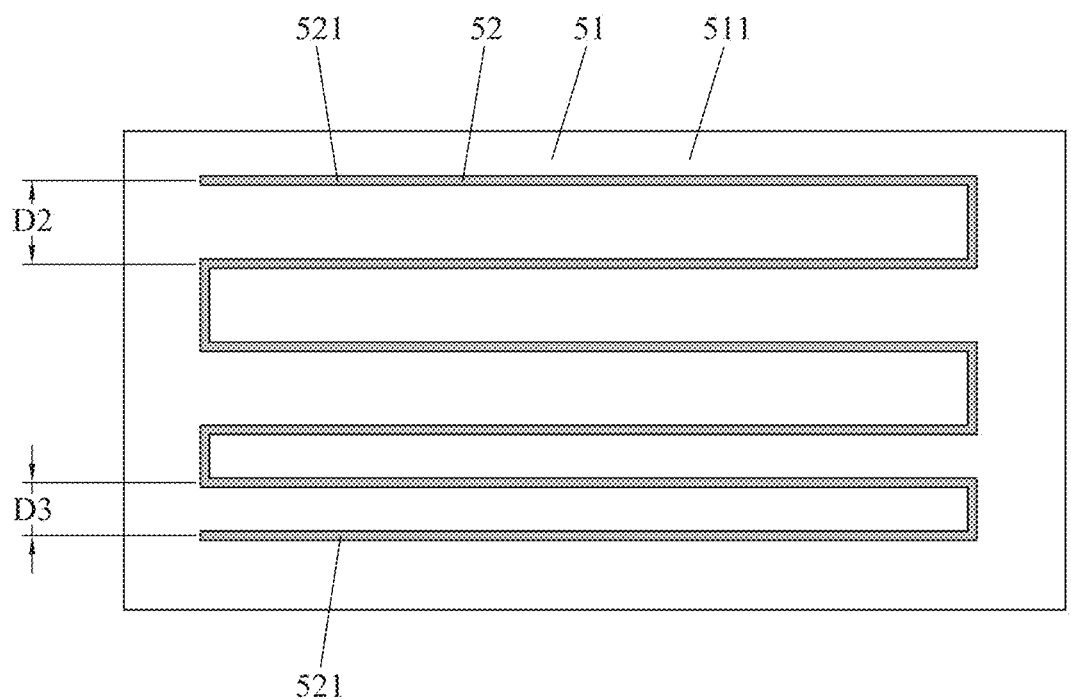
FIG. 8 is a diagrammatic view illustrating disposition of a heating layer of the vehicle lamp of another embodiment according to the present invention.

FIG. 8 shows a vehicle lamp of a second embodiment according to the present invention which is similar to the first embodiment shown in FIGS. 1-7. The differences between the second embodiment and the first embodiment will be set forth hereinafter. Specifically, the heating layer 52 includes at least one heating wire 521 that extends continuously and back and forth without intersection. In another embodiment (not shown), the heating wire 521 can have other winding patterns, such as circular, arcuate, etc. The present invention is not limited in this regard.

An overall area of an upper portion of the heating wire 521 above a central portion of the substrate 51 is smaller than an overall area of a lower portion of the heating wire 521 below the central portion of the substrate 51. Furthermore, a spacing D2 between two adjacent parallel sections of the upper portion of the heating wire 521 is larger than a spacing D3 between two adjacent parallel sections of the lower portion of the heating wire 521. In another embodiment (not shown), the spacing between two adjacent parallel sections of the heating wire 521 gradually increases from the lower portion towards the upper portion of the heating wire 521. Since hot air tends to flow upwards, the temperature above the lens 4 will be larger than the temperature below the lens 4. By the arrangement of the heating wire 521, the heat distribution of the lens 4 is more uniform and, thus, provides a better effect for removing condensed substances (such as snow, frost, ice, or fog), avoiding substances residing at a lower temperature portion. Furthermore, in a further embodiment, the diameter of the heating wire 52 can be varied to achieve a uniform heating effect.

Although specific embodiments have been illustrated and described, numerous modifications and variations are still possible without departing from the scope of the invention. The scope of the invention is limited by the accompanying claims.

The invention claimed is:

1. A vehicle lamp with a heating function comprising:
a housing including a compartment having an opening;
a reflective unit mounted in the compartment of the housing;
a lighting unit mounted in the compartment of the housing, wherein the lighting unit includes a first circuit board and a first light emitting diode;
a lens mounted to a front end of the housing and covering the opening of the compartment, wherein the lens includes a front surface and a rear surface, wherein the reflective unit reflects light rays from the first light emitting diode to transmit through the lens;
a heating unit including a substrate made of a light transmittable material and a heating layer, wherein the substrate includes a front face and a rear face, wherein the heating layer is disposed on the substrate and is configured to proceed with an electrical heating operation; and
a sensor mounted in the compartment of the housing and configured to detect temperature,
wherein the heating unit further includes a circuit board, wherein a portion of the substrate and a portion of the heating layer are bent rearwards to form an electrical connection section, and wherein the electrical connection section is electrically connected to the circuit board,
wherein when the detected temperature is lower than a first predetermined temperature, the heating layer is activated to proceed with the electrical heating operation, and wherein when the detected temperature is higher than a second predetermined temperature, the electrical heating operation of the heating layer is stopped or gradually reduced.

2. The vehicle lamp with the heating function as claimed in claim 1, wherein the heating layer is disposed between the substrate and the lens.

3. The vehicle lamp with the heating function as claimed in claim 1, wherein the heating unit further includes a connection seat adjacent to the rear surface of the lens, and wherein the circuit board is mounted to a rear side of the connection seat.

4. The vehicle lamp with the heating function as claimed in claim 3, wherein the connection seat includes a through-hole, and wherein the electrical connection section extends through the through-hole of the connection seat to electrically connect with the circuit board.

5. The vehicle lamp with the heating function as claimed in claim 3, wherein at least one partitioning board extends rearwards from a center of the compartment, and wherein the connection seat is mounted around the at least one partitioning board.

6. The vehicle lamp with the heating function as claimed in claim 5, wherein the lighting unit further includes a second circuit board and a second light emitting diode mounted on the second circuit board, wherein the reflective unit includes a first reflective hood and a second reflective hood, wherein the first reflective hood is disposed in the compartment at a location above the at least one partitioning board, wherein the second reflective hood is disposed in the compartment at a location below the at least one partitioning board, and wherein the first and second circuit boards are received in the compartment of the housing and align with the first and second reflective hoods, respectively.

7. The vehicle lamp with the heating function as claimed in claim 1, wherein the heating layer includes at least one heating wire not extending to an end of the electrical connection section, wherein the circuit board includes a coupler having a groove receiving a plurality of electrical connection plates, wherein the end of the electrical connection section is folded and inserted into the groove to electrically connect the at least one heating wire to the plurality of electrical connection plates.

8. The vehicle lamp with the heating function as claimed in claim 7, wherein the end of the electrical connection section includes at least one guiding angle portion.

9. The vehicle lamp with the heating function as claimed in claim 1, wherein the heating layer includes at least one heating wire extending continuously and back and forth without intersection, and wherein an overall area of an upper portion of the heating wire above a central portion of the substrate is smaller than an overall area of a lower portion of the heating wire below the central portion of the substrate.

10. The vehicle lamp with the heating function as claimed in claim 1, wherein the heating layer includes at least one heating wire extending continuously and back and forth without intersection, and wherein a spacing between two adjacent parallel sections of an upper portion of the heating wire is larger than a spacing between two adjacent parallel sections of a lower portion of the heating wire.

11. A method for manufacturing components of the vehicle lamp with the heating function as claimed in claim 1, with the method comprising:
   disposing the heating layer on the substrate;
   placing the substrate with the heating layer in a mold;
   injecting a material of the lens into the mold to form the lens, with the lens securely bonded to the substrate, and with the heating layer sandwiched between the lens and the substrate.

12. The method for manufacturing components of the vehicle lamp with the heating function as claimed in claim 11, wherein the mold includes a first mold part and a second mold part, wherein the mold includes a side having a feeding inlet, permitting injection of the material of the lens into the mold, wherein the first mold part includes a recessed portion corresponding to the substrate with the heating layer, wherein when the rear surface of the substrate with the heating layer is placed into the recessed portion of the first mold part, the front surface of the substrate with the heating layer and the inlet at the side of the mold have a height difference therebetween.

13. The method for manufacturing components of the vehicle lamp with the heating function as claimed in claim 12, wherein the recessed portion includes at least one vacuum suction portion, and wherein the at least one vacuum suction portion includes circular or slit-shaped cross sections.

14. The method for manufacturing components of the vehicle lamp with the heating function as claimed in claim 12, wherein the recessed portion includes at least one vacuum suction portion, wherein the heating layer includes at least one heating wire, and wherein the at least one vacuum suction portion completely or partially overlaps with the at least one heating wire.

15. The method for manufacturing components of the vehicle lamp with the heating function as claimed in claim 12, wherein a portion of the substrate and a portion of the heating layer are bent rearwards to form an electrical connection section, wherein the first mold part includes a groove, and wherein the electrical connection section is received in the groove.

16. The method for manufacturing components of the vehicle lamp with the heating function as claimed in claim 15, wherein the groove includes an end edge having an arcuate portion in a range of 1.5-2.5 mm, and wherein the arcuate portion is configured to guide the electrical connection section into the groove.

* * * * *